United States Patent
Reber et al.

(10) Patent No.: US 10,103,241 B2
(45) Date of Patent: Oct. 16, 2018

(54) MULTIGATE TRANSISTOR

(71) Applicant: NXP USA, INC., Austin, TX (US)

(72) Inventors: Douglas Michael Reber, Austin, TX (US); Mehul D. Shroff, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/452,014

(22) Filed: Mar. 7, 2017

(65) Prior Publication Data
US 2018/0261682 A1   Sep. 13, 2018

(51) Int. Cl.
*H01L 29/78* (2006.01)
*H01L 29/66* (2006.01)

(52) U.S. Cl.
CPC .. *H01L 29/66484* (2013.01); *H01L 29/66795* (2013.01)

(58) Field of Classification Search
CPC ................... H01L 29/66484; H01L 29/66795
USPC ....................................................... 438/283
See application file for complete search history.

(56) References Cited

U.S. PATENT DOCUMENTS

| 4,948,456 | A  | 8/1990  | Schubert           |
| 5,580,802 | A  | 12/1996 | Mayer et al.       |
| 6,605,847 | B2 | 8/2003  | Kim et al.         |
| 8,173,993 | B2 | 5/2012  | Bangsaruntip et al.|
| 8,361,869 | B2 | 1/2013  | Zhou et al.        |
| 8,384,065 | B2 | 2/2013  | Bangsaruntip et al.|
| 8,735,869 | B2 | 5/2014  | Cappellani et al.  |
| 9,570,551 | B1 * | 2/2017 | Balakrishnan ...... H01L 29/0673 |
| 9,947,775 | B2 * | 4/2018 | Balakrishnan ...... H01L 29/6681 |
| 2004/0063286 | A1 * | 4/2004 | Kim ................ H01L 21/82341 438/283 |
| 2005/0266645 | A1 * | 12/2005 | Park ..................... H01L 29/1033 438/282 |
| 2006/0016471 | A1 * | 1/2006 | Greiff ..................... H02S 10/30 136/253 |
| 2007/0004117 | A1 * | 1/2007 | Yagishita .............. H01L 21/845 438/197 |
| 2008/0261358 | A1  | 10/2008 | Sonsky |
| 2011/0284382 | A1 * | 11/2011 | Park ........................ C23C 26/00 205/50 |

(Continued)

OTHER PUBLICATIONS http://phys.org/news/2016-06-imec-gate-all-around-mosfets-lateral-silicon.html, "Imec demonstrates gate-all-around MOSFETs with lateral silicon nanowires at scaled dimensions", downloaded Jan. 11, 2017.

(Continued)

*Primary Examiner* — Victoria K Hall
(74) *Attorney, Agent, or Firm* — David G. Dolezal

(57) ABSTRACT

A multigate transistor is formed on a wafer with a first material and a second material. Portions of the second material are selectively removed from the first material to form an opening in the first material. An epitaxially grown semiconductor material is grown from a seed layer into the opening. A portion of the first material is removed around the epitaxially grown semiconductor material in the opening and a gate material is formed in locations of the removed first material. The epitaxially grown semiconductor material in the opening serves as a channel region for a multigate transistor and the gate material serves as a gate for the multigate transistor.

15 Claims, 17 Drawing Sheets

(56) References Cited

U.S. PATENT DOCUMENTS

| | | | |
|---|---|---|---|
| 2012/0052674 A1* | 3/2012 | Lee | H01L 27/11578 438/591 |
| 2013/0341704 A1 | 12/2013 | Rachmady et al. | |
| 2014/0021538 A1 | 1/2014 | Bangsaruntip et al. | |
| 2016/0118480 A1* | 4/2016 | Xie | H01L 29/66795 257/347 |
| 2016/0365411 A1* | 12/2016 | Yeh | H01L 29/0673 |
| 2017/0140933 A1* | 5/2017 | Lee | H01L 29/0649 |
| 2018/0033871 A1* | 2/2018 | Xie | H01L 29/66795 |

OTHER PUBLICATIONS https://www.elen.ucl.ac.be/dice/soi/activities/gaa.html, "Gate-All-Around transistors and circuits", downloaded Jan. 11, 2017.

Zamir, S., et al., "Lateral confined epitaxy of GaN layers on Si substrates"; Journal of Crystal Growth 230 (2001), 341-345; http://sciencedirect.com/science/article/pii/S002202480102477.

Gaillardon, P., et al., "Vertically-Stacked Double-Gate Nanowire FETs with Controllable Polarity: From Devices to Regular ASICs", EPFL, Lausanne, Switzerland, EDAA 2013.

Neudeck, G., et al., "Novel Silicon Epitaxy for Advanced MOSFET Devices", Electrical and Computer Engineering, Purdue University, IEEE 2000.

Kastenmeier, B.E.E., et al, "Highly Selective etching of silicon nitride over silicon and silicon dioxide", J. Vac. Sci. Technol. A 17(6), Nov./Dec. 1999.

http://www.semiconductor-today.com/news_items/2012/DEC/PURDUE_211212.html, "Setting up the Christmas tree for 4D electronics", Dec. 21, 2012.

http://www.fz-juelich.de/pgi/pgi-9/DE/Forschung/05-Si-Nano-MOSFET/01-Multigate%20nanowire/artikel.html, "Gate-all-around (GAA) Nanowire (NW) MOSFETs", downloaded Feb. 17, 2017.

http://www.fz-juelich.de/pgi/pgi-9/EN/Forschung/05-Si-Nano-MOSFET/03_TunnelFET/artikel.html, "Tunnel FET—Green Transistor", downloaded Feb. 17, 2017.

\* cited by examiner

US 10,103,241 B2

MULTIGATE TRANSISTOR

BACKGROUND OF THE INVENTION

Field of the Invention

This invention relates in general to multigate transistors.

Description of the Related Art

A multi-gate transistor is a transistor that has a gate structure on more than one side of a channel region. Examples of multigate transistors include double gate transistors, a tri-gate FinFET transistors, and gate all around (GAA) transistors. The gate structures on each side of the channel region can be electrically connected (e.g. integrally connected or by a conductive structure) or can be electrically separate from each other (e.g. a split gate FinFET). In some examples, the electrically separate gates are separately controllable from each other.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments, a multigate transistor is formed on a wafer with a first material and a second material. Portions of the second material are selectively removed from the first material to form an opening in the first material. An epitaxially grown silicon is grown from a seed layer into the opening. A portion of the first material is removed around the epitaxially grown silicon in the opening and a gate material is formed in locations of the removed first material. The epitaxially grown silicon in the opening serves as a channel region for a multigate transistor and the gate material serves as a gate for the multigate transistor.

Providing such a method of forming a multigate transistor may allow in some embodiments, multiple channel regions to be formed during the same epitaxial growth process from the same seed layer, wherein each epitaxially grown channel region has the same crystal orientation.

Figure 1:
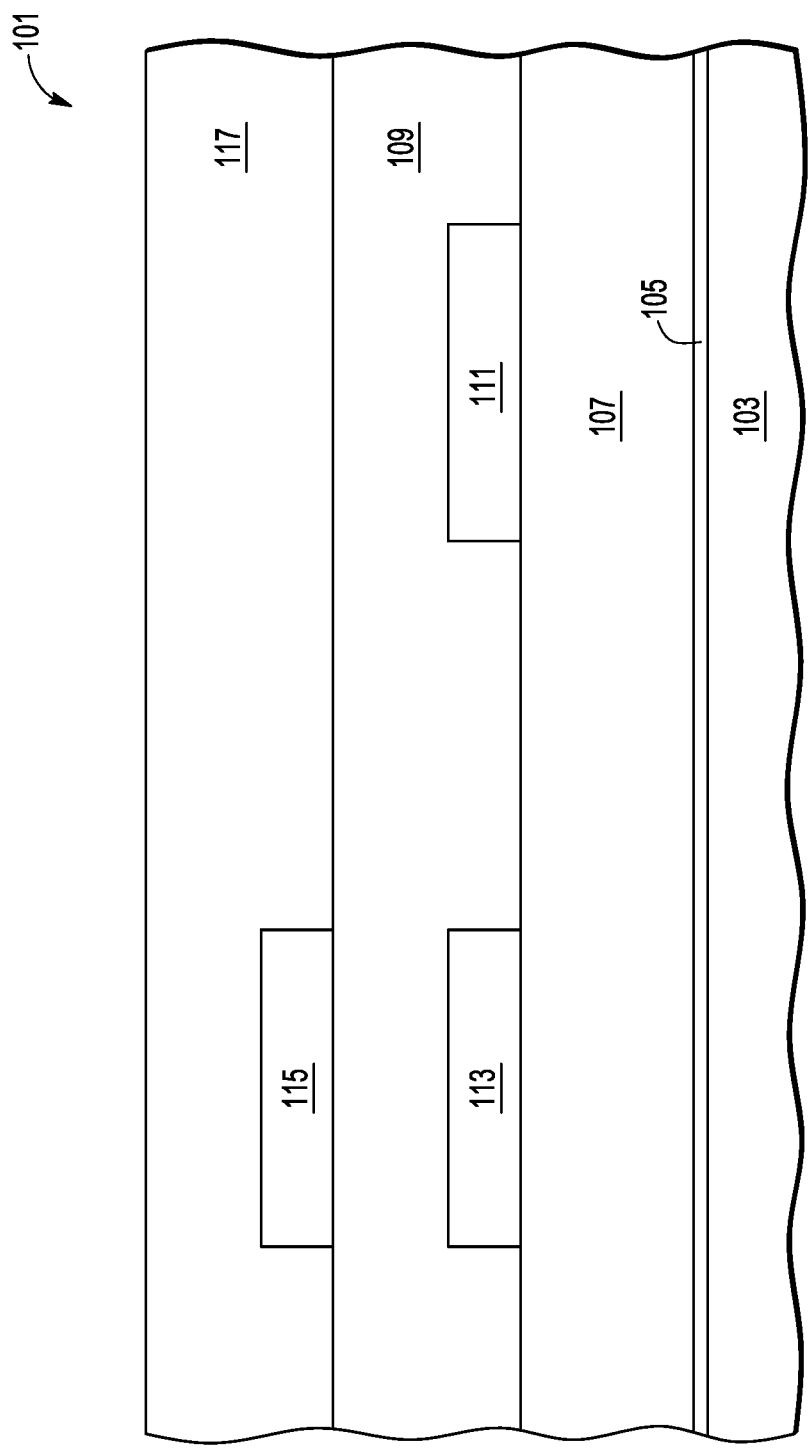
FIGS. 1-14 are partial cross-sectional side views of a wafer at various stages during the manufacture of multigate transistors according to one embodiment of the present invention.

FIG. 1 is a partial cross-sectional side view of a wafer 101 used for forming multigate transistors according to one embodiment of the present invention. Wafer 101 includes a substrate 103 of a single crystal semiconductor material. In one embodiment, substrate 103 is made of bulk monocrystalline silicon having a crystal orientation of <100>, but may be made of other semiconductor materials, for example, GaAs, ZnO, GaN, SiGe, AlP, InGaAs, SiC, GaP, or other IV or III-V semiconductor materials, in other embodiments. In some embodiments, substrate 103 may be made of a crystalline dielectric material (e.g. sapphire $Al_2O_3$). Also in other embodiments, substrate 103 may have other crystal orientations (e.g. <110>). Substrate 103 will provide a crystal lattice template for subsequent epitaxial growth of channel regions of multigate transistors formed on wafer 101.

A layer 105 of silicon nitride is located on substrate 103. In one embodiment, layer 105 is formed by a nitridation process with an ammonia precursor at 1050 C for 15 minutes followed by a nitrogen anneal for 30 minutes. However, layer 105 may be formed by other processes such as e.g. a plasma-enhanced chemical vapor deposition (PECVD) process in other embodiments. In some embodiments, layer 105 is 100-200 Angstroms thick, but may be of other thicknesses in other embodiments. Layer 105 will subsequently serve as an etch stop layer.

Layer 107 is formed over layer 105 and is made of silicon oxide. In one embodiment, layer 105 is formed by an oxide deposition process and has a thickness in the range of 200-2000 Angstroms, but may be formed by other processes and may have other thicknesses in other embodiments. Structures 113 and 111 are formed on layer 107. In one embodiment, structures 113 and 111 are made of silicon but may be made of other materials that are etch selectable with the material of layer 107 in other embodiments. Structures 113 and 111 are formed by forming a layer (not shown) of the structure material over layer 107 and then patterning the layer to form structures 113 and 111. In one embodiment, structures 113 and 111 have a thickness of 400 Angstroms or less, but may have other thicknesses in other embodiments. The size and shape of structures 113 and 111 will determine the size and shape of subsequently formed channel region structures for multigate transistors.

After the formation of structures 113 and 111, layer 109 is formed on wafer 101. Layer 109 may be formed by a similar process as used to form layer 107. In one embodiment, layer 109 is formed by depositing a conformal layer of silicon dioxide on wafer 101 and then planarizing layer 109.

After the formation of layer 109, structure 115 is formed on layer 109 in a similar manner to structure 113. In one embodiment, structure 115 is made of silicon and has a same thickness as structure 113. Afterwards, layer 117 is formed on wafer 101. In one embodiment, layer 117 is made of silicon dioxide and is formed in the same manner as layer 109. However, in some embodiments, layer 117 may be thicker than layer 109 to account for subsequent planarization steps.

In the embodiment shown, the portion of wafer 101 shown on the left side of FIG. 1 includes two structures 115 and 113 stacked over each other whereas the portion on the right side shows only one structure 111. Accordingly, as will be shown later, a transistor (1305 in FIG. 13) formed on the portion shown on the left side of FIG. 1 will have two stacked channel region structures (801 and 803) whereas a transistor (1307) to be formed on the right side will have only one channel region structure (805). However, in other embodiments, a transistor may have more than two stacked channel region structures, wherein more than two structures similar to structures 113 and 115 would stack on each other.

Figure 15:
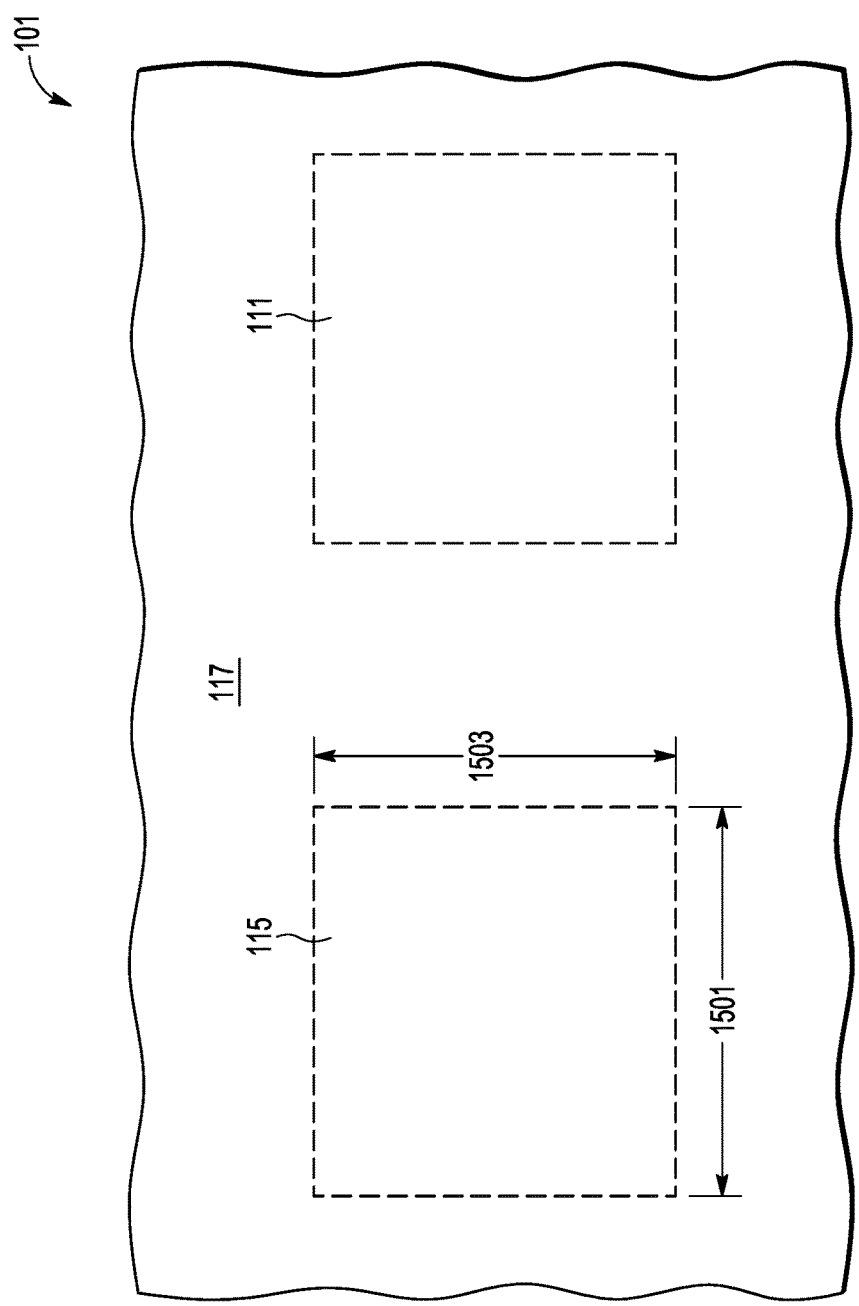
FIGS. 15 and 16 are partial top views of a wafer at various stages during the manufacture of multigate transistors according to one embodiment of the present invention.

FIG. 15 shows a partial top view of wafer 101 at the stage shown in FIG. 1. The structures 115 and 111 are shown in dashed lines in that they are covered by layer 117. In the embodiment shown, structure 113 is of the same dimensions and as structure 115 and is aligned with structure 115 such that it is not shown in FIG. 15. However, in other embodiments, two structures in a stack may be of different dimensions and/or may be offset from one another.

In one embodiment, dimension 1501 is in the range of 0.001-10 μm, but may be of other lengths in other embodiments. In one embodiment, dimension 1503 is in the range of 0.001-10 μm, but may be of other lengths in other embodiments. The length of the transistor channel is dependent on dimension 1501 and the width of the transistor channel is defined by dimension 1503. In some embodiments, either of (or both of) dimension 1501 or dimension 1503 may the lowest definable process dimension (e.g. 40 nm, 28 nm, 14 nm) of the process node utilized to make the transistor. In the embodiment shown, structures 115 and 111 have rectangular shapes. However, in other embodiments, they may have other shapes.

Figure 2:
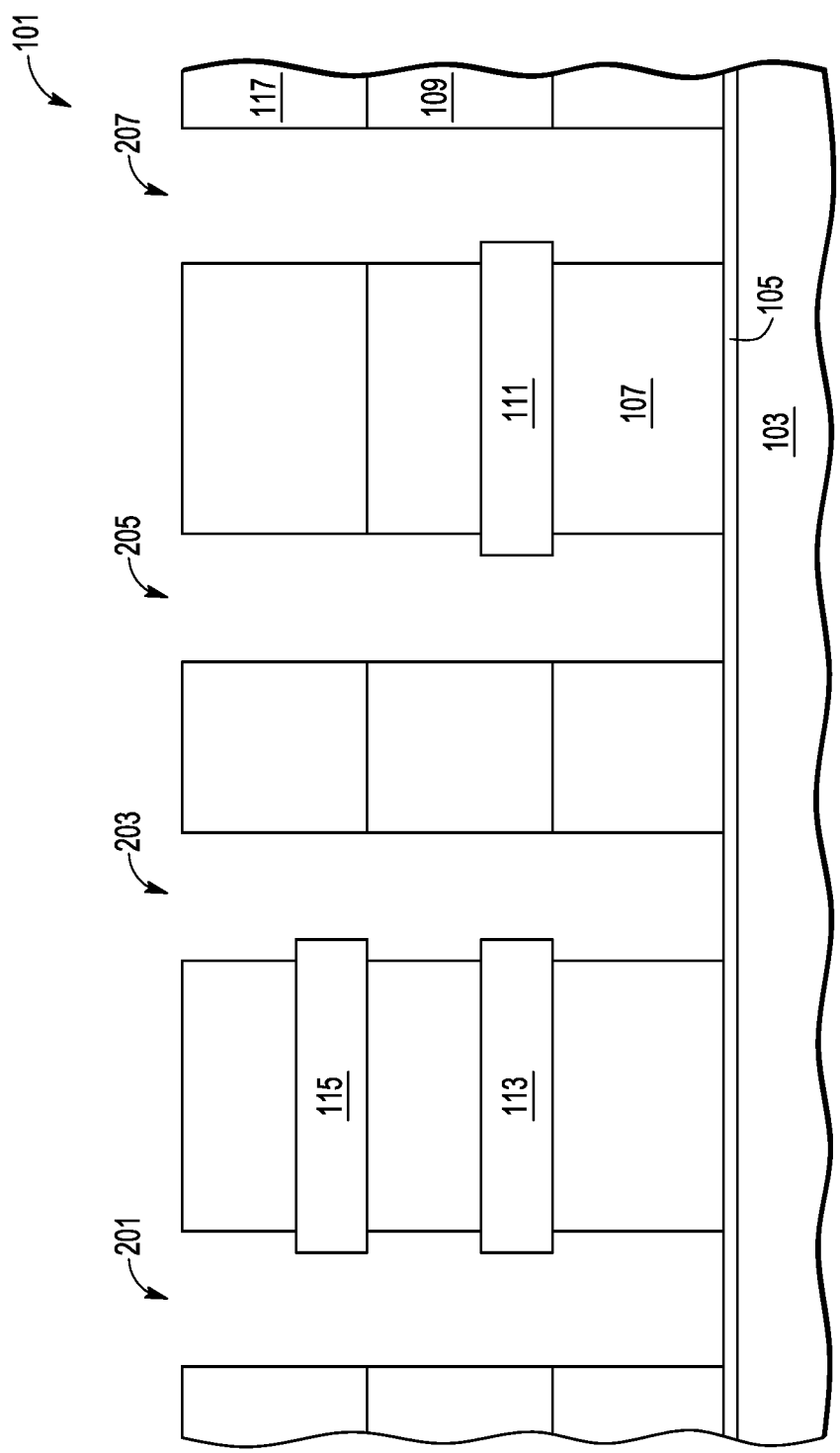

FIG. 2 is a partial cross-sectional side view of wafer 101 after openings 201, 203, 205, and 207 are formed in wafer 101 to expose the end portions of structures 115, 113, and 111. The openings may be formed by patterning a mask (not shown) with openings at the corresponding locations of openings 201, 203, 205, and 207. Wafer 101 is then etched with a plasma anisotropic etchant (e.g. $CF_4$ and $NF_3$) that is selective to the silicon oxide of layers 107, 109, and 117 and is selective with respect to the silicon of structures 115, 113, and 111 and with respect to the silicon nitride of etch stop layer 105. The anisotropic etchant is then followed by an isotropic etchant that is selective to and is selective with respect to the same materials as the anisotropic etchant so as to allow structures 115, 113, and 111 to protrude from the sidewalls of openings 201, 203, 205, and 207.

Figure 3:
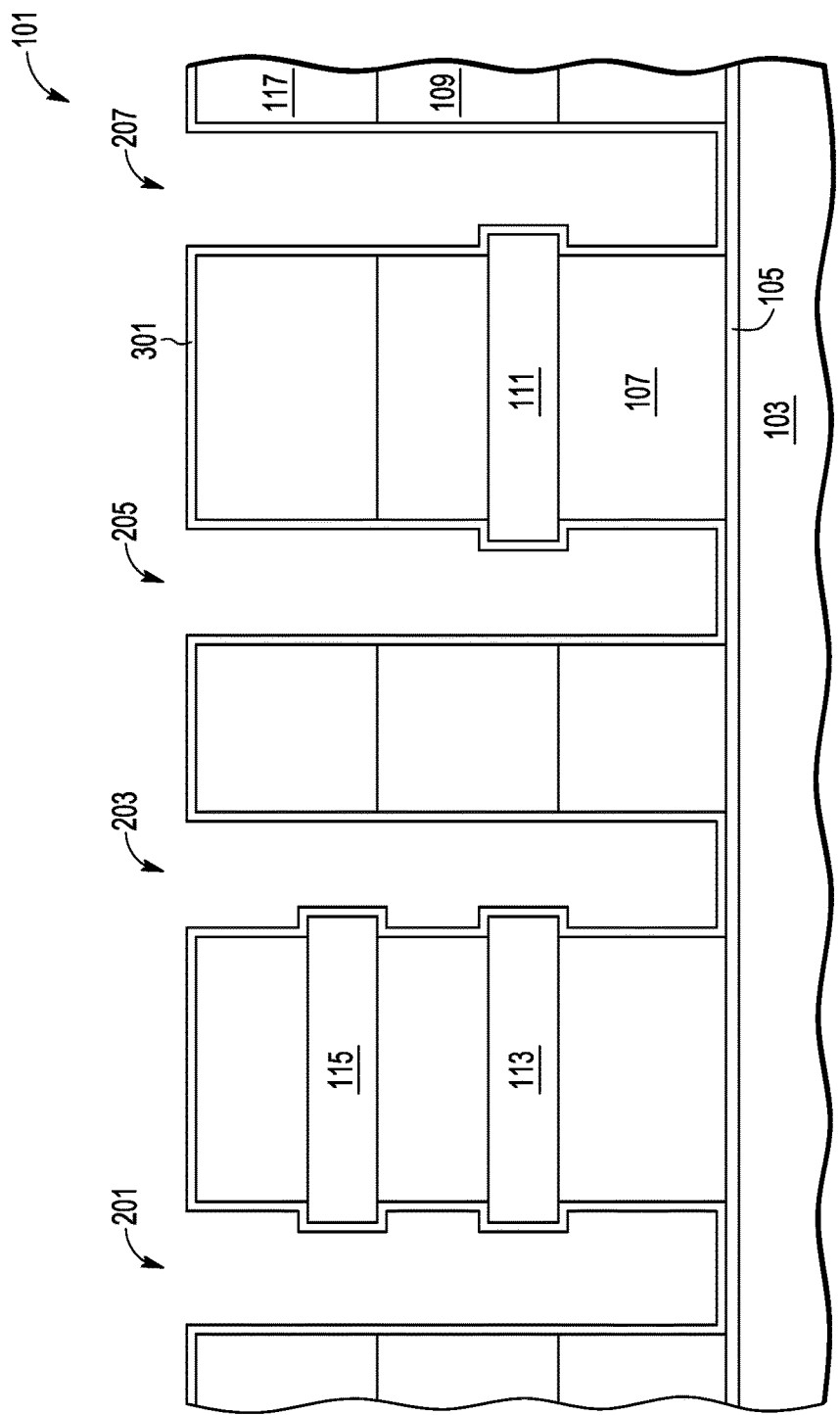

FIG. 3 shows a partial cross-sectional side view of wafer 101 after a layer 301 of nitride is formed over wafer 101. In one embodiment, layer 301 has a thickness of 15-100A, but may be of other thicknesses in other embodiments. In one embodiment, the thickness of layer 301 is dependent on a desired separation between a subsequently formed gate (e.g. 1301) and source/drain (1001). See FIG. 16.

Figure 4:
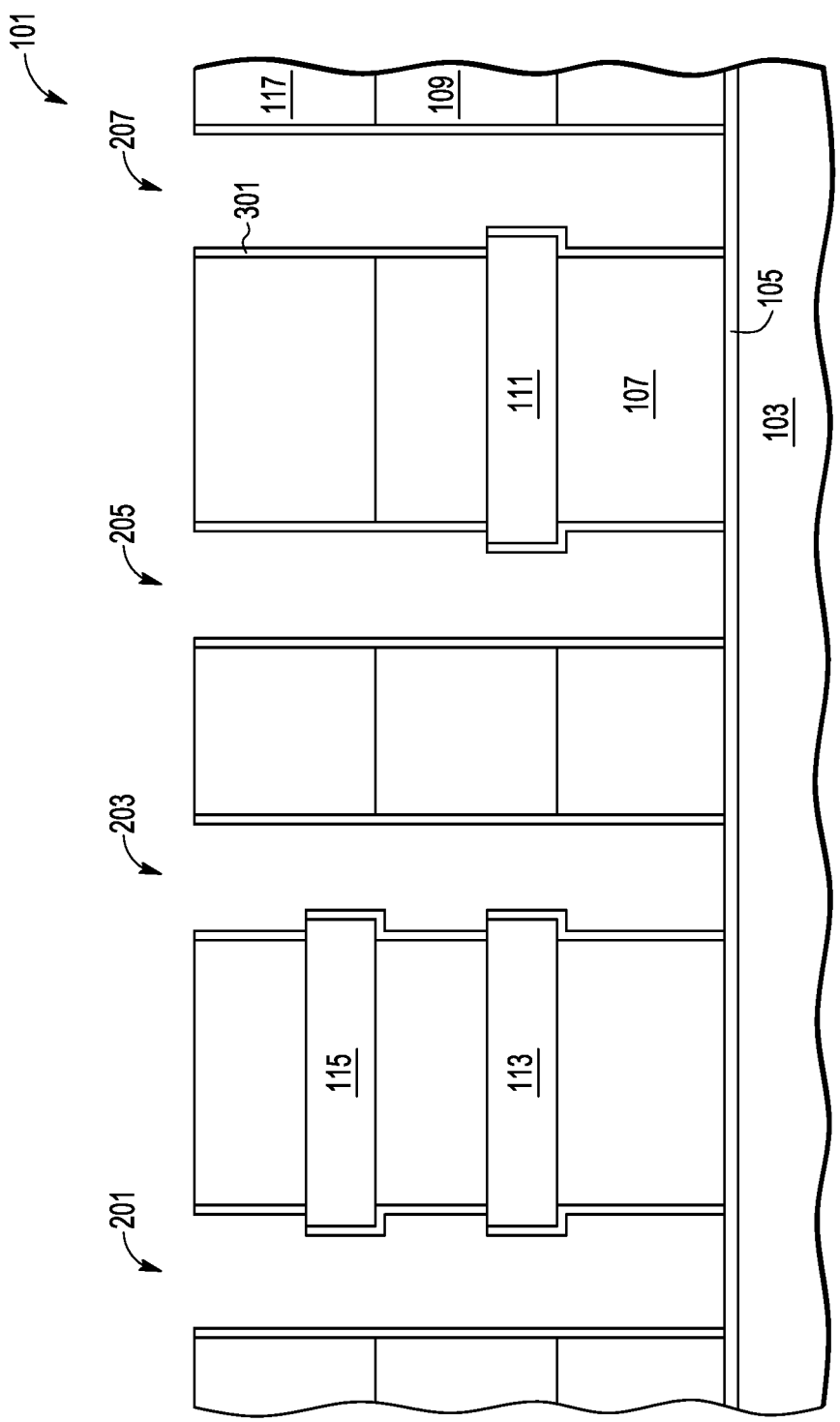

FIG. 4 shows a partial cross-sectional side view of wafer 101 after an anisotropic etch of layer 301 is performed on wafer 101 to remove the portions of layer 301 on layer 117 and on the protruding portions of structures 115, 113, and 111.

Figure 5:
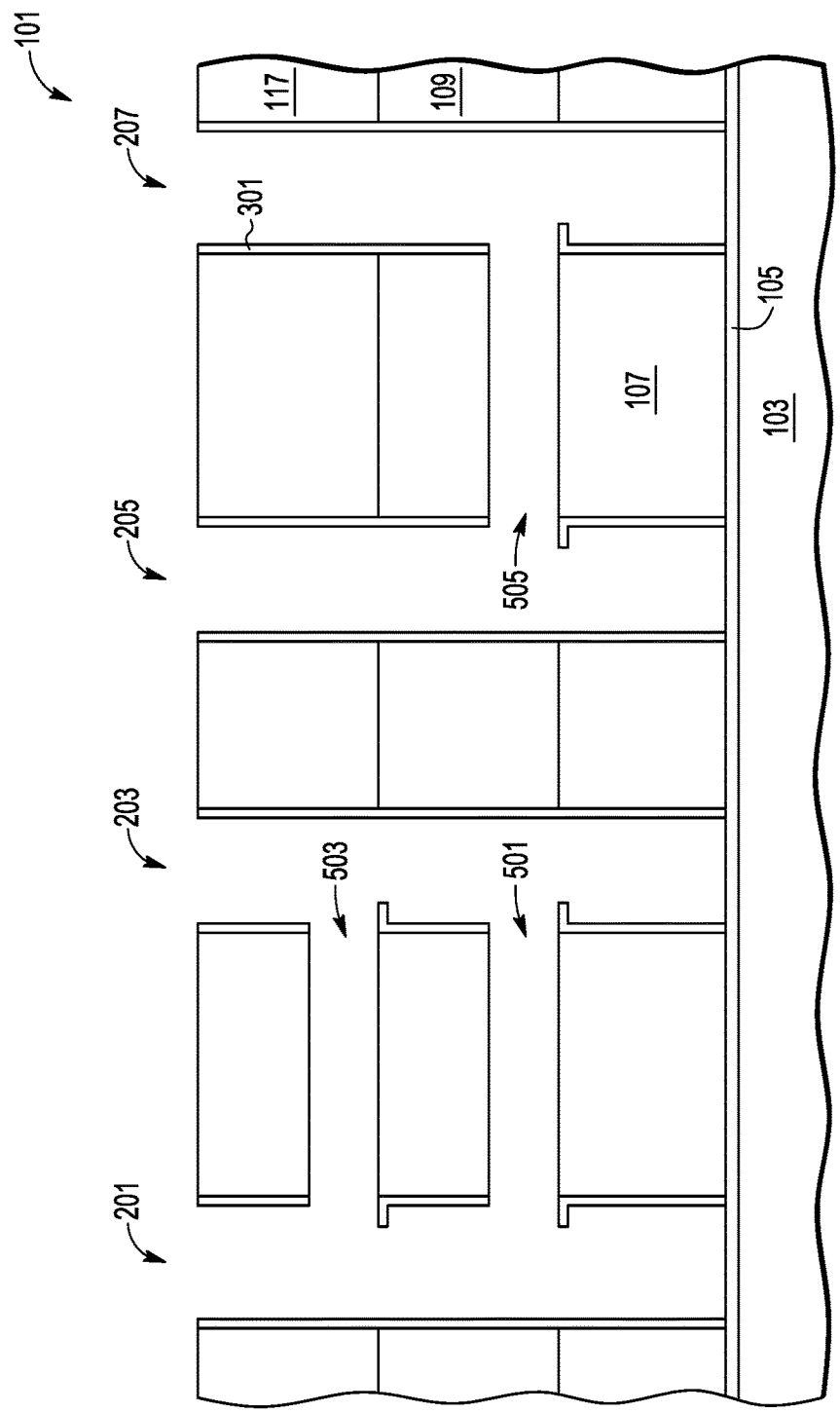

FIG. 5 shows a partial cross-sectional side view of wafer 101 after silicon structures 115, 113, and 111 are removed with an isotropic etchant (e.g. $Cl_2$ and $BCl_3$) that is selective to silicon and is selective with respect to silicon dioxide and silicon nitride. The removal of structures 115, 113, and 111 forms openings 503, 501, and 505, respectively, in the silicon oxide material of layers 107, 109 and 117. With the removal of structures 115, 113, and 111, a portion of layer 301 on the ends of those structures also is removed due to breakage. However, in some embodiments, a light anisotropic etching of the nitride layer 301 may be performed to remove some of the nitride of layer 301 on those structures.

Figure 6:
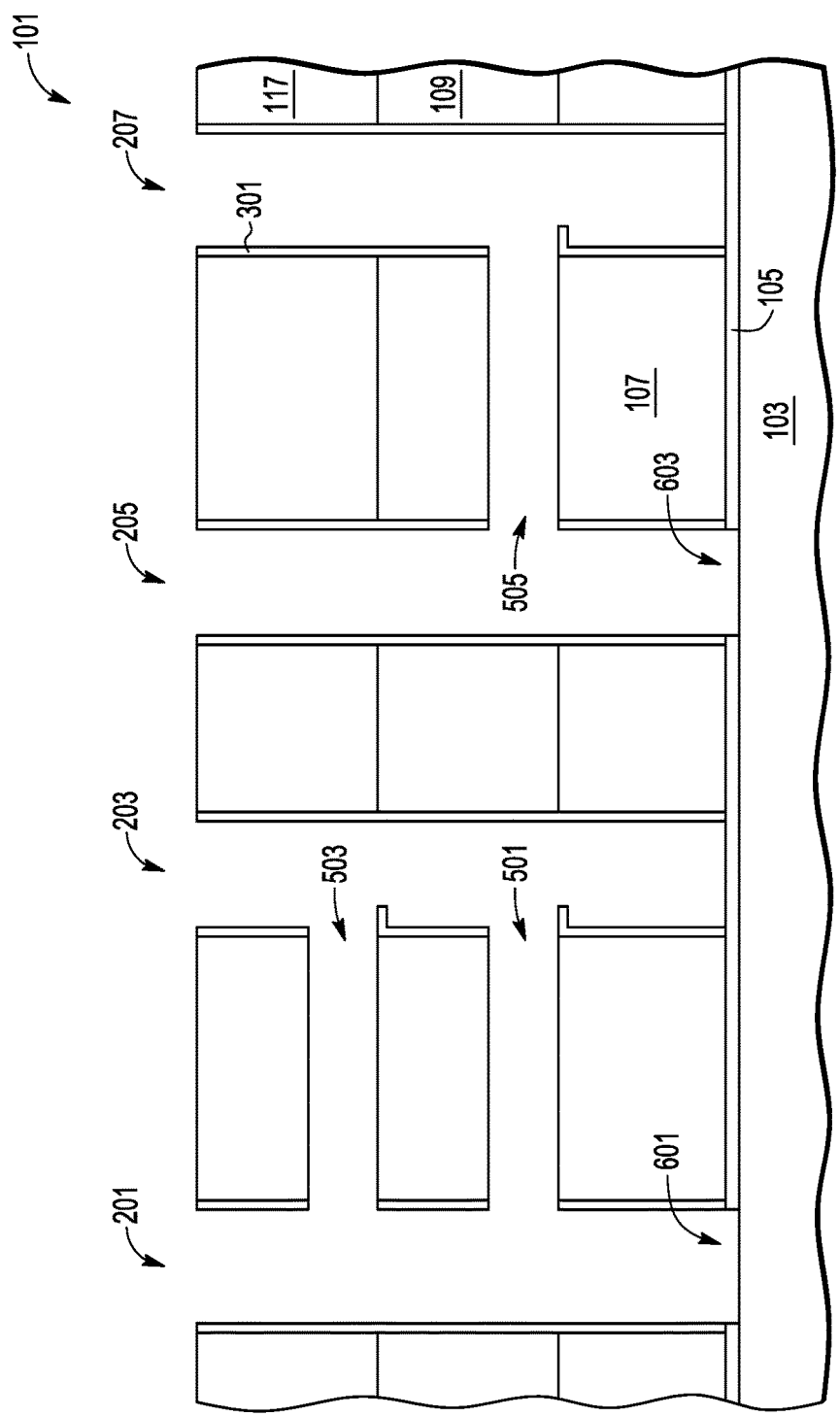

FIG. 6 shows a partial side view of wafer 101 after openings 601 and 603 are formed in layer 105. The openings are formed by forming a mask (not shown) over wafer 101 and then forming openings in the mask over openings 201 and 205. Wafer 101 is subjected an anisotropic etch e.g. of $CH_3F$ or $CH_2F_2$ to remove the silicon nitride of layer 105 at the bottom of openings 201 and 205. Layer 105 is not removed at the bottom of openings 203 and 205.

Figure 7:
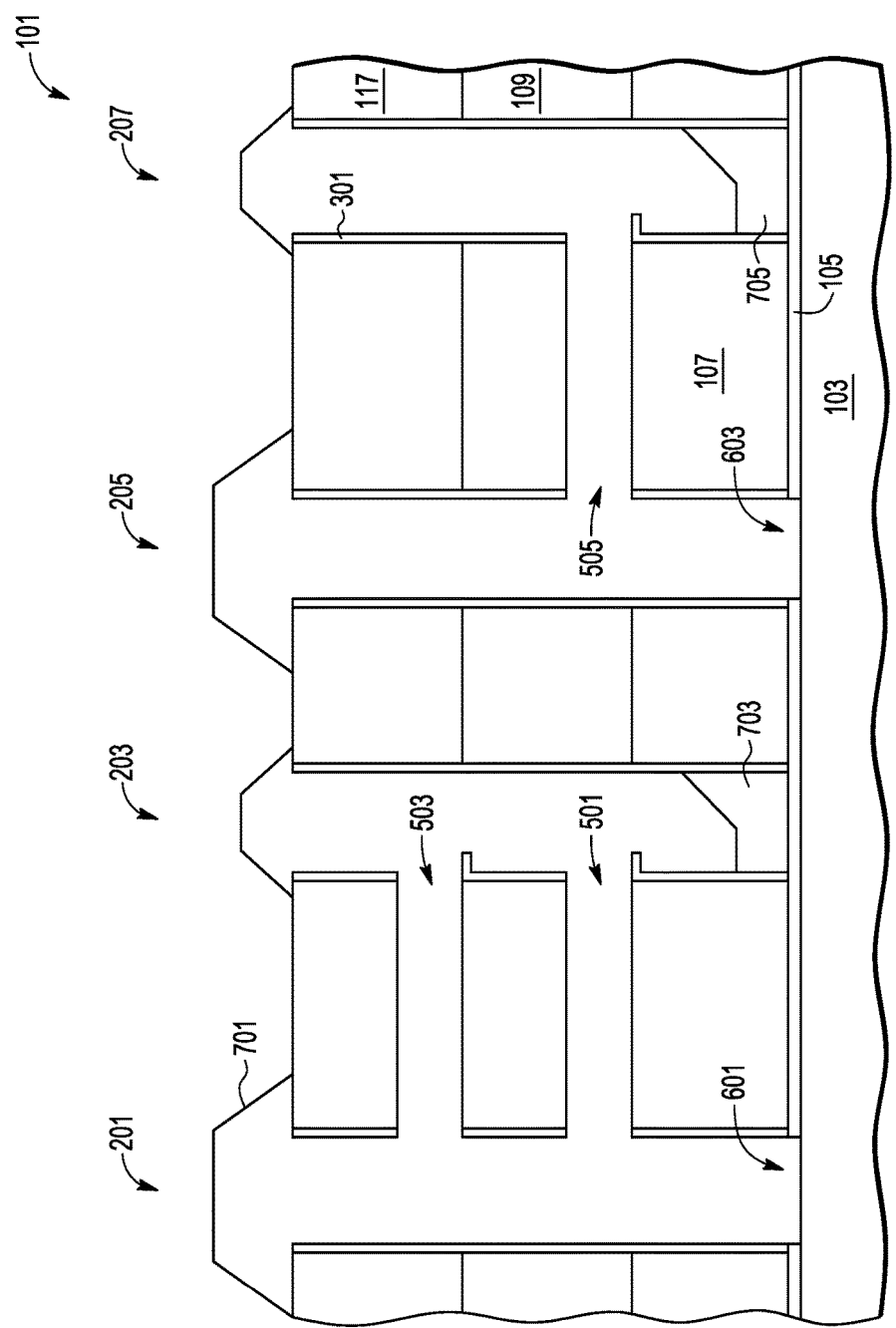

FIG. 7 shows a partial cross-sectional side view of wafer 101 after semiconductor material 701 is epitaxially grown from substrate 103, through openings 601 and 603, through openings 201 and 205, through openings 501, 503, and 505, and in openings 203 and 207. Because nitride layer 105 was not removed from openings 203 and 207, voids 703 and 705, respectively, are created in those openings due to the blockage of the epitaxial precursor at those locations when openings 203 and 207 become blocked with semiconductor material. In one embodiment, the epitaxially grown semiconductor material 701 is the same material as substrate 103. However, in other embodiments, it may be a different type of semiconductor material. For example, substrate 103 can be bulk silicon and material 701 can be ZnO, GaAs, GaN, SiGe, AlP, InGaAs, SiC, GaP, or another semiconductor material. Because material 701 is epitaxially grown from substrate 103 (which acts as a seed layer), it has the same crystal orientation as substrate 103. Accordingly, the semiconductor material formed in each of openings 503, 501, and 505 has the same crystalline orientation. In some embodiments, providing channel regions with the same crystal orientation may provide for a more predictable transistor performance across multiple devices. Also, in some embodiments, providing a single seed source for each active channel structure may ensure that the channel structures are not polycrystalline in that grain boundaries may drastically impact device performance. Afterwards, wafer 101 is planarized to remove excess semiconductor material above layer 117. In other embodiments, material 701 may be grown from another layer that is formed over substrate 103.

In some embodiments, a thin layer of nitride (not shown) may be formed on the exposed surfaces of wafer 101 after the stage of FIG. 5 but prior to the stage of FIG. 6 to increase the thickness of layer 301 on the sidewalls of openings 201, 203, 205, and 207.

Figure 8:
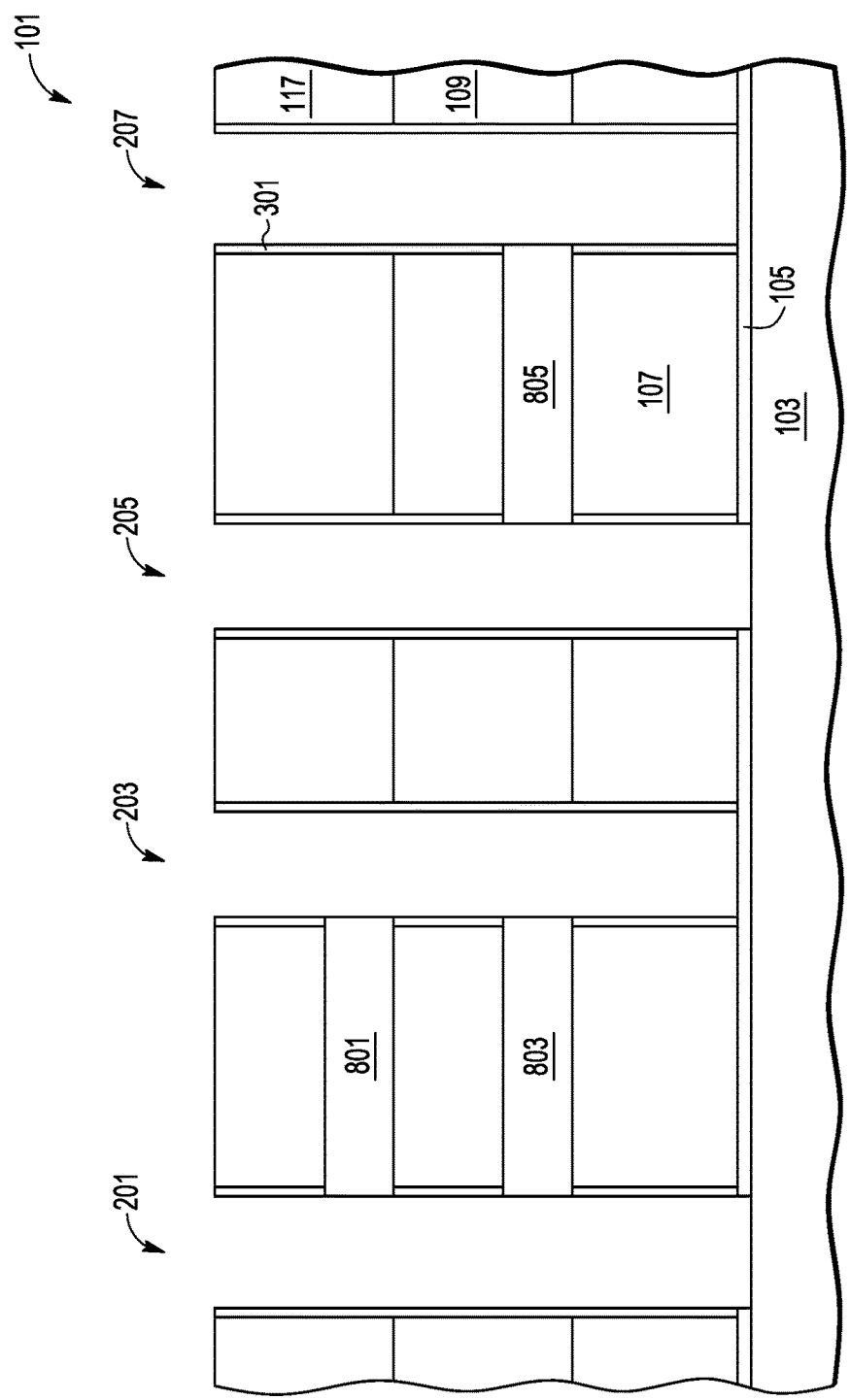

FIG. 8 shows a partial cross-sectional side view of wafer 101 after material 701 has been anisotropically etched to remove material 701 from openings 201, 203, 205, and 207. The epitaxially grown material 701 remains in the openings 503, 501, and 505 to form channel structures 801, 803, and 805, all of which have the same crystal orientation.

Figure 9:
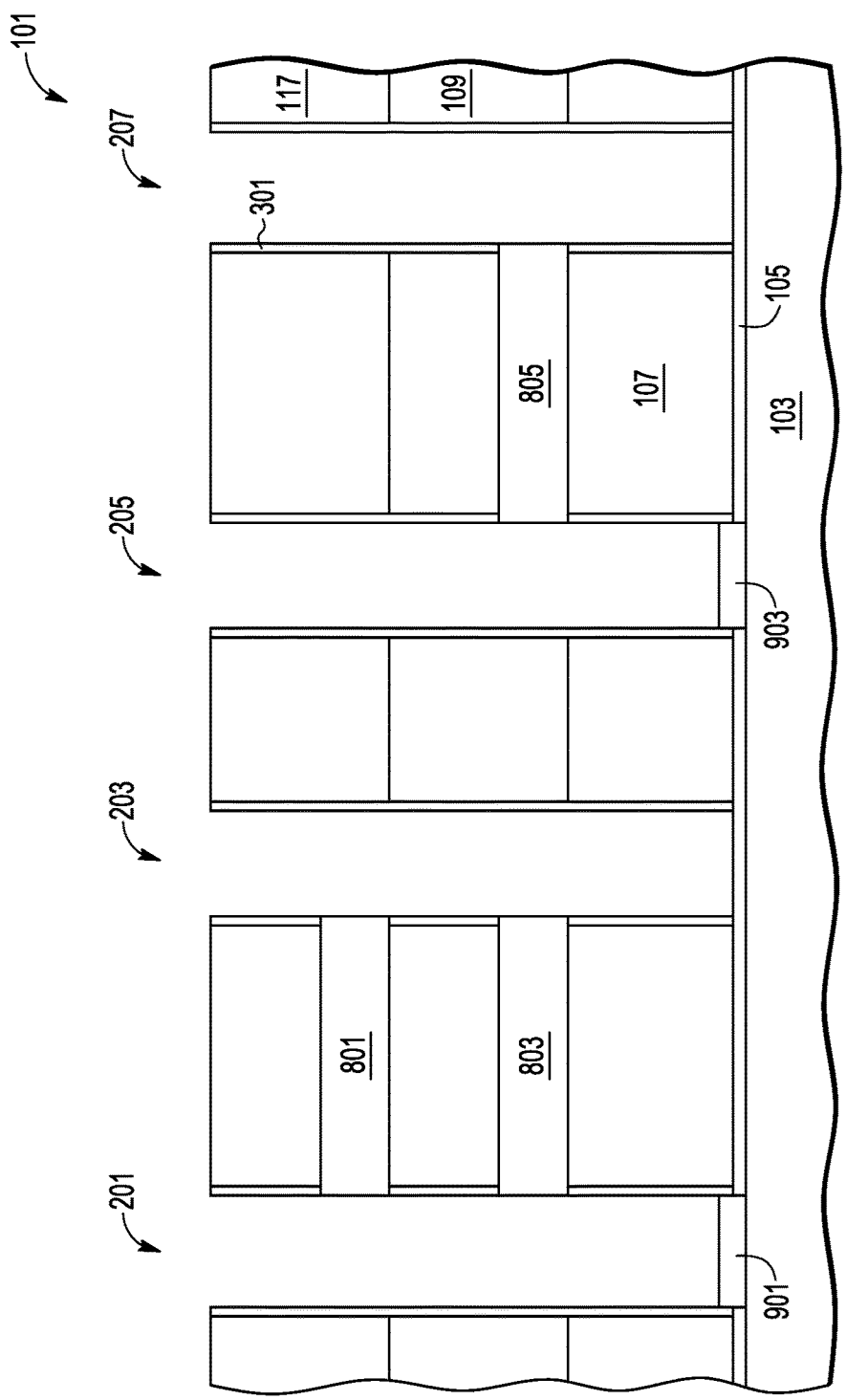

FIG. 9 shows a partial cross-sectional side view of wafer 101 after dielectric structures 901 and 903 are formed in bottom of openings 201 and 205 to isolate substrate 103 from the subsequently formed source/drain structures in those openings. In one embodiment, structures 901 and 903 are formed by an anodic oxidation process that oxidizes an exposed portion of substrate 103. With an anodic oxidation process, substrate 103 is biased at a specific potential such that atoms react to exposed portions of substrate 103. Channel structures 801, 803 and 805 do not oxidize during the anodic oxidation process because they are unbiased. In other embodiments, a chemical oxidation process may be performed. In still other embodiments, structure 901 can be formed by a deposition process that deposits material mainly on flat surfaces and not on vertical surfaces (e.g. a highly anisotropic deposition process). Such a process would be followed by a light isotropic etch to remove any of the deposited material on a sidewall and then followed by a planarization process to remove material on layer 117. In other embodiments, structures 901 and 903 would not be formed in order to electrically couple substrate 103 to subsequently formed source/drains 1001 and 1005. In still other embodiments wherein a crystalline dielectric material such as sapphire is implemented for substrate 103, structures 901 and 903 would not be formed.

Figure 10:
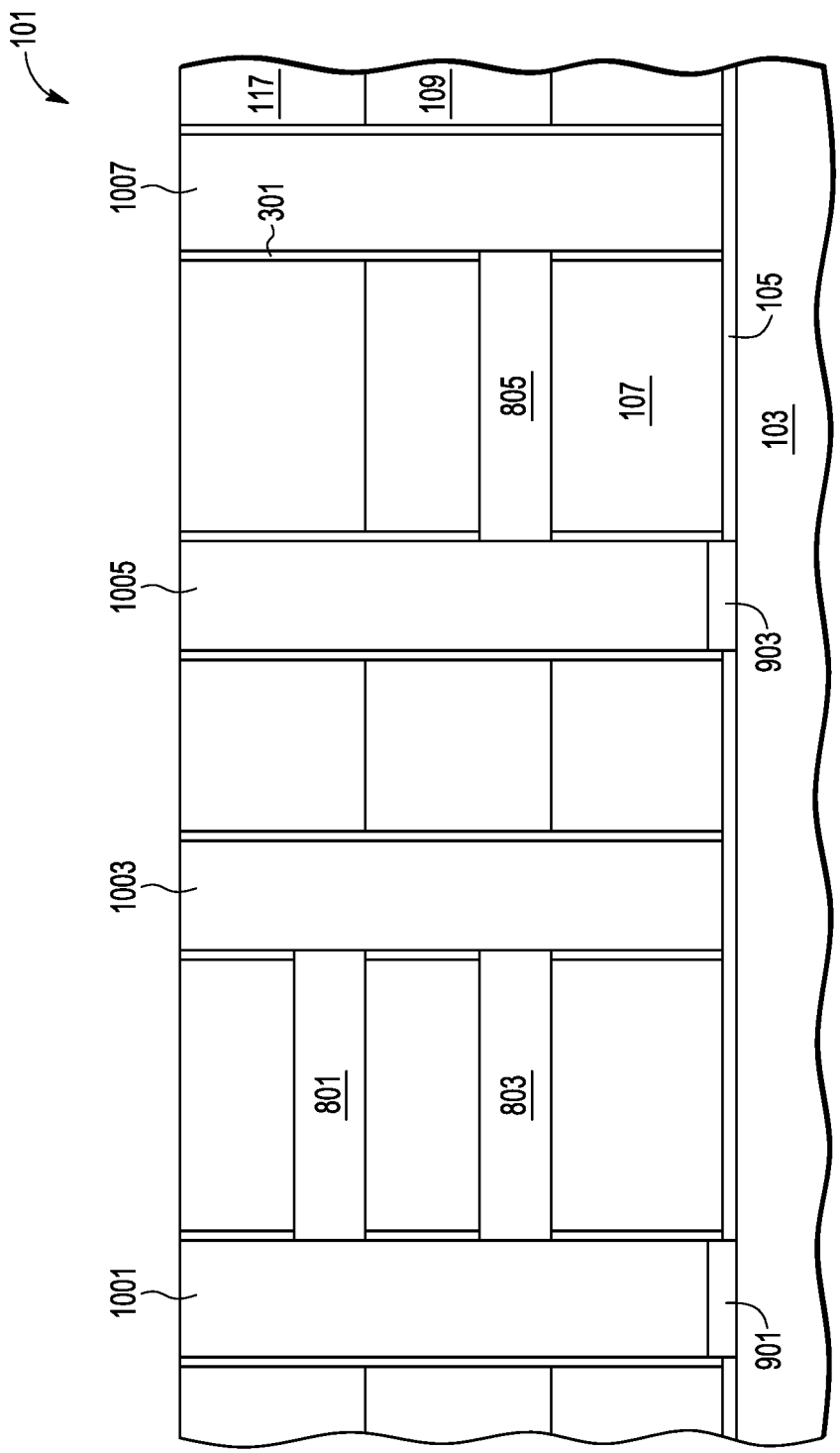

FIG. 10 shows a partial cross-sectional side view of wafer 101 after source/drains 1001, 1003, 1005, and 1007 are formed by the deposition of a source/drain conductive material (e.g. cobalt, tungsten, nickel, etc.) over wafer 101 followed by a planarization of wafer 101. The source/drains (1001, 1003, 1005, and 1007) electrically contact the channel structures (801, 803, and 805). In some embodiments, the source/drains may include a barrier layer (not shown). A source and drain are current terminals for a FET device.

Figure 11:
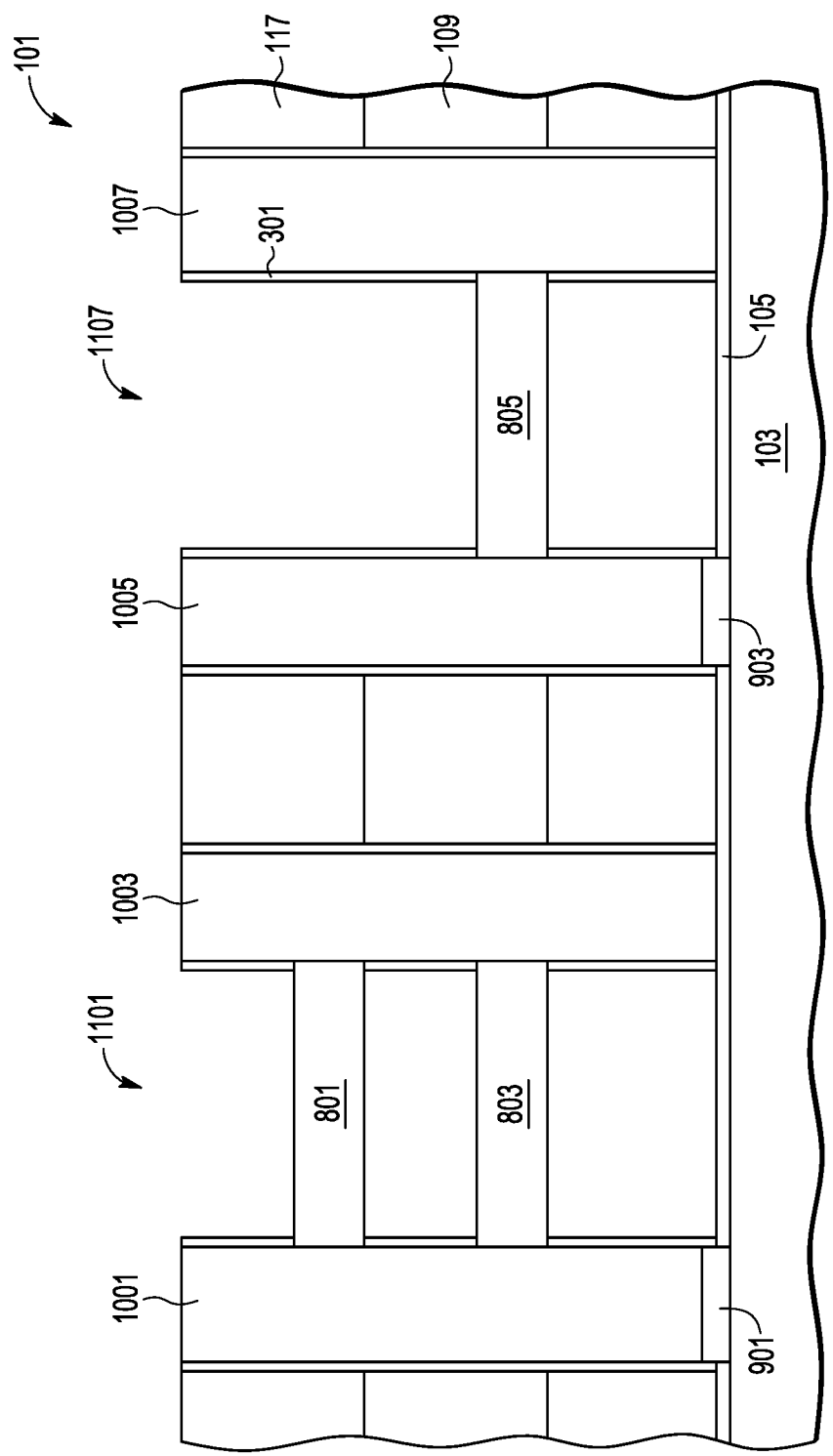

FIG. 11 shows a partial cross-sectional side view of wafer 101 after portions of layer 107, 109, and 117 are removed by a selective isotropic etch. The etching is performed by forming a mask (not shown) and then subjecting the exposed portions of the mask with an etchant. The etching of these layers creates an opening 1101 between source/drain 1001 and 1003 and an opening 1107 between source/ drains 1005 and 1007. The openings expose the top, bottom and lateral surfaces of channel structures 801, 803, and 805 between the source/drains.

Figure 12:
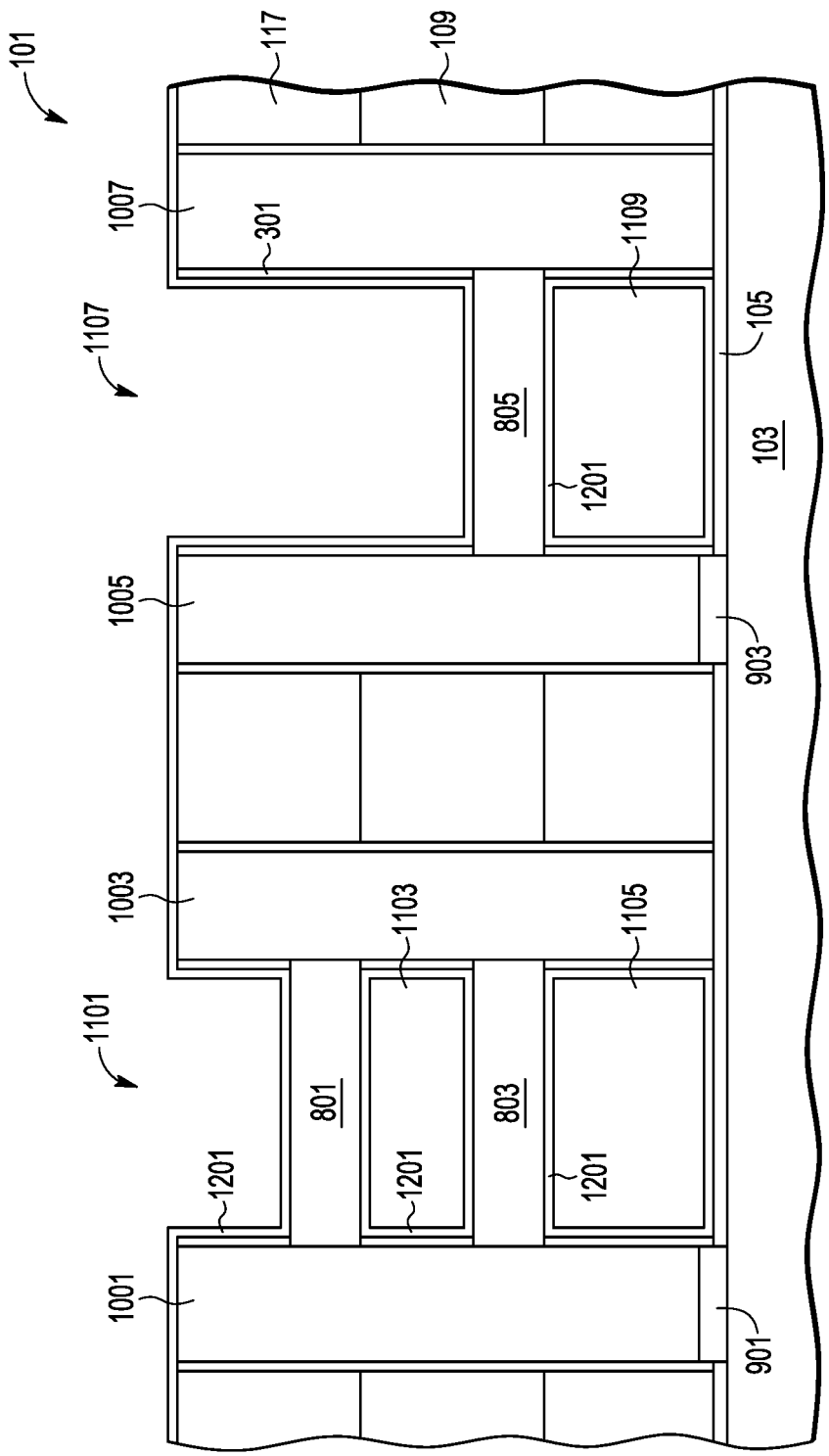

FIG. 12 is a partial cross-sectional side view of wafer 101 after gate dielectric is formed on all exposed surfaces of wafer 101 including on the exposed surfaces of the channel structures 801, 803, and 805. In one embodiment, layer 1201 includes a high K dielectric metal oxide (e.g. hafnium oxide) that is deposited by an atomic layer deposition (ALD) process. In one embodiment, layer 1201 is 1-2 nm thick, but may be of other thicknesses in other embodiments. Layer 1201 may also be a combination of dielectric layers in some embodiments, such as silicon dioxide, silicon oxynitride, and hafnium oxide.

Figure 13:
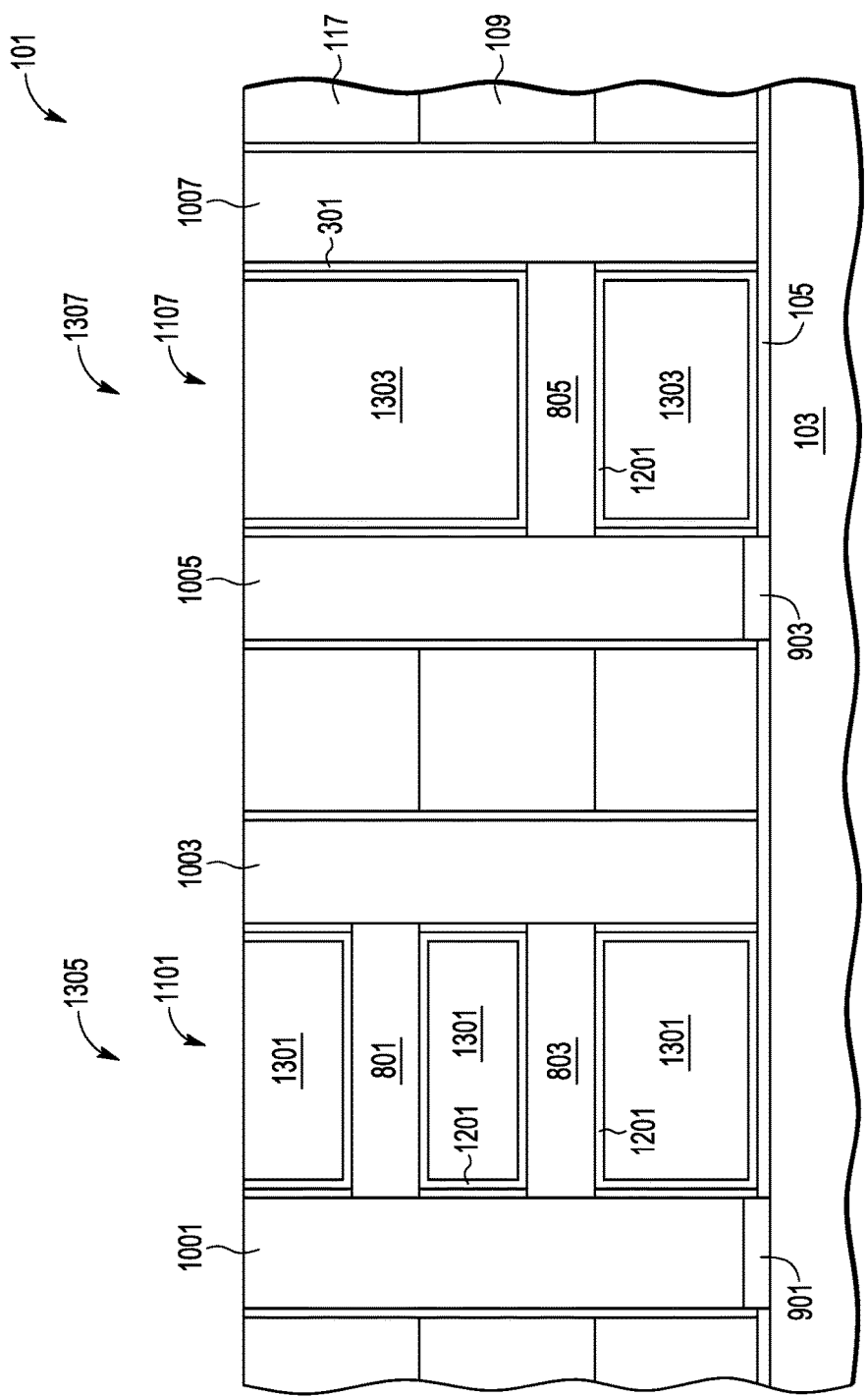

FIG. 13 is a partial cross-sectional side view of wafer 101 after the deposition of a layer (not shown) of gate material over wafer 101 including in openings 1101 and 1107 that surround the channel structures 801, 803 and 805. Wafer 101 is then planarized to form gate structure 1301 and gate structure 1303. In one embodiment, the gate material is a metal (e.g. TiAlN, TiN), or a combination of different metal layers, and/or polysilicon. In one embodiment, the layer of gate material is formed by an ALD process. In other embodiments, the gates may be formed of other materials and/or by other processes.

FIG. 13 shows two transistors. Transistor 1305 includes gate structure 1301, source/drains 1001 and 1003, and channel structures 801 and 803. Gate structure 1301 individually surrounds channel structure 801 and individually surrounds channel structure 803 in a plane that is perpendicular to the general current flow through the channel region. Transistor 1307 includes gate structure 1303, source/drains 1005 and 1007, and channel structure 805. In the embodiment shown, both transistors 1305 and 1307 are characterized as GAA (gate all-around) transistors because the gate structures (1301 and 1303) each individually surround the channel structures (801, 803, and 805) of the transistor in a plane perpendicular to the general current flow.

Figure 16:
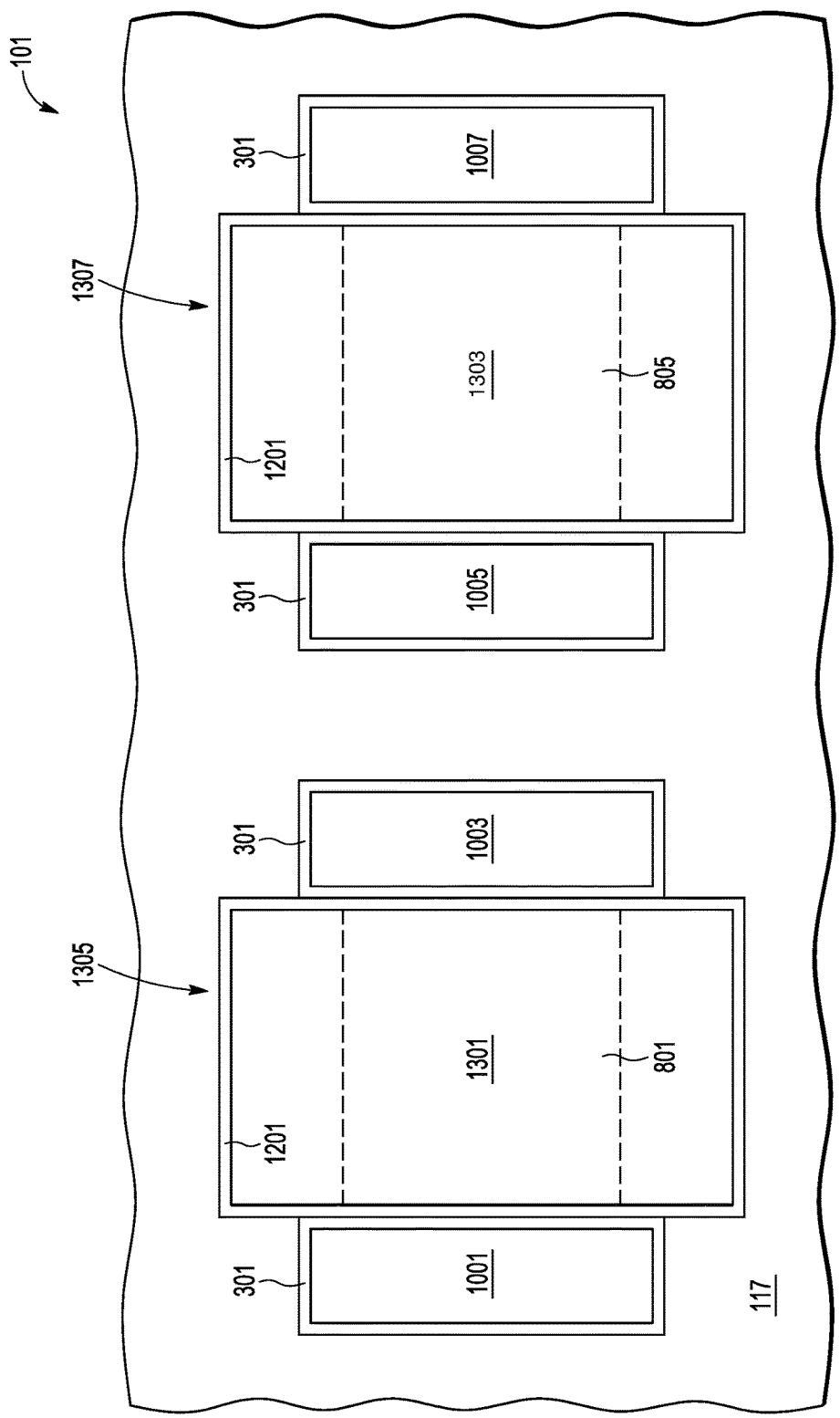

FIG. 16 is a partial top view of wafer 101 at the stage of FIG. 13. FIG. 16 shows a top view of transistors 1305 and 1307. Channel structures 801 and 805 are shown in dashed lines. As can be seen in FIG. 16, gate structure 1301 extends out further laterally (up and down in the view of FIG. 16) than structure 801 such that gate structure 1301 surrounds the lateral sides of channel structure 801. As shown in FIG. 16, nitride layer 301 and gate dielectric layer 1201 provide separation between gate structure 1301 and source/drains 1001 and 1003.

Figure 14:
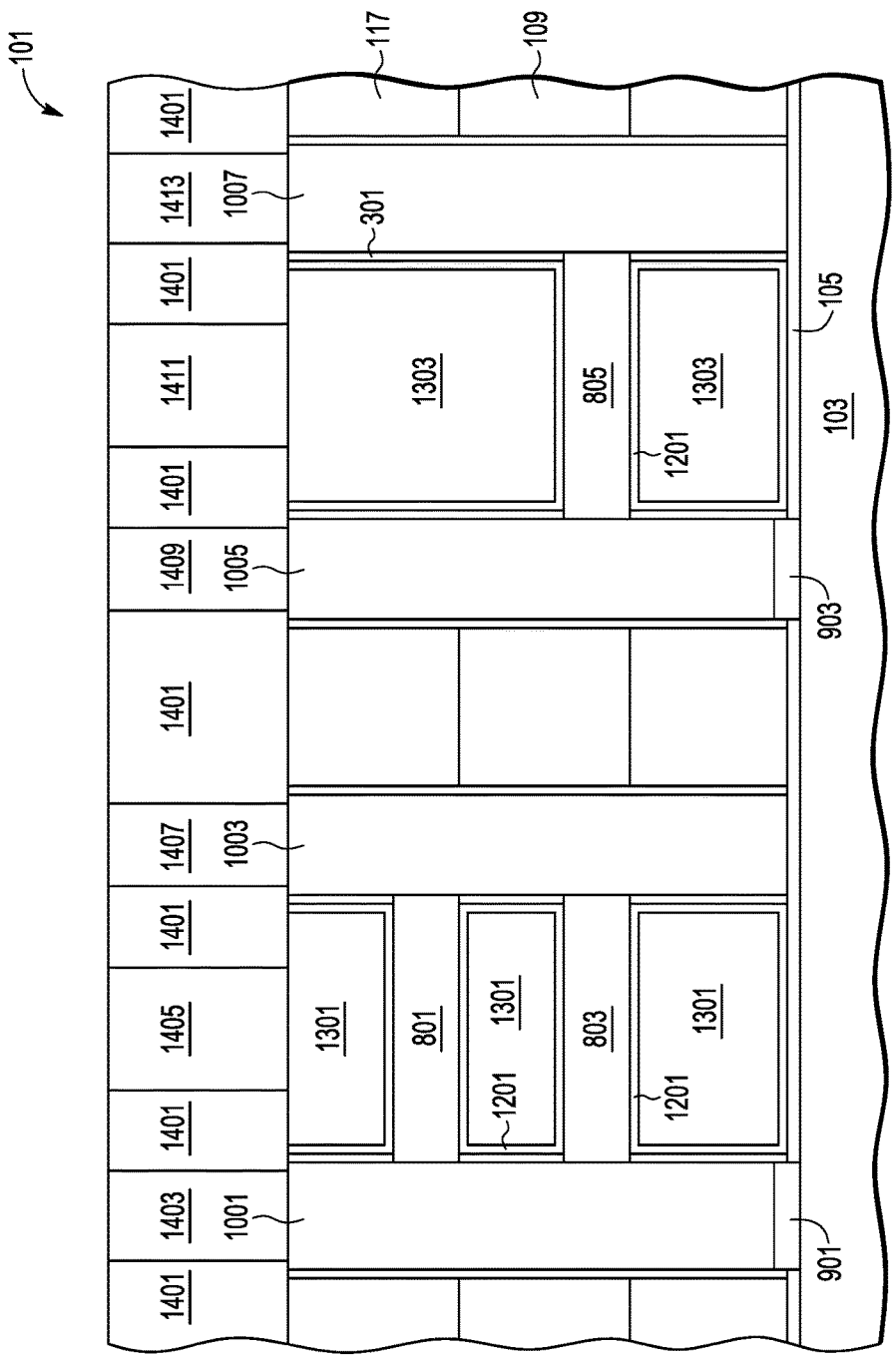

FIG. 14 is a partial cutaway side view of wafer 101 after contacts 1403, 1405, 1407, 1409, 1411, and 1413 are formed to contact source/drain 1001, gate structure 1301, source/drain 1003, source drain 1005, gate structure 1303, and source/drain 1007, respectively. In one embodiment, the contacts are made from tungsten, but may be made of other materials in other embodiments. In one embodiment, a layer 1401 of dielectric material (silicon oxide) is formed over wafer 101. The layer is patterned to form openings for the contacts. A layer of contact metal is then formed over wafer 101 including in the openings. Afterwards, wafer 101 is planarized. In other embodiments, the contacts for a transistor would be located offset from each other such that not all would be located in a single cross-section of a wafer.

In subsequent process, additional interconnects layers are formed over wafer 101 to interconnect the transistors 1305 and 1307 to other transistors formed on wafer 101 and to external terminals (e.g. pads, bumps, posts). Afterwards, the wafer is singulated into multiple integrated circuits, each with multiple transistors similar to transistors 1305 and 1307. The integrated circuits are then packaged into integrated circuit packages and implemented in other systems such as electronic systems.

Other embodiments may have other structures, be made by other processes, and/or be formed from other materials. For example, although structures 115, 113, and 111 are described above as made of silicon and layers 107, 109, and 117 are made of silicon dioxide, these structures may be made of other materials that are etch selective with respect to each other (e.g. nitride, silicon oxynitride) in other embodiments. Furthermore, in some embodiments, the nitride structures can be made of an oxide and the oxide structures can be made of a nitride. In still other embodiments, the semiconductor material 701 formed in openings 201, 203, 205, and 207 can be doped with a conductivity dopant to form the source/drain regions for transistor 1305 and 1307. Furthermore, in some embodiments, the channel structures (801, 803, and 805) may be subject to an isotropic etch after the stage of FIG. 11 and before the stage of FIG. 12 to reduce the thickness and width of each channel structure.

In other embodiments, a transistor may include more than two channel structures stacked on each other. Also in other embodiments, separate channel structures may be located laterally from each other to increase the width of a transistor without decreasing the ratio of channel/gate surface area to width of a transistor.

Figure 17:
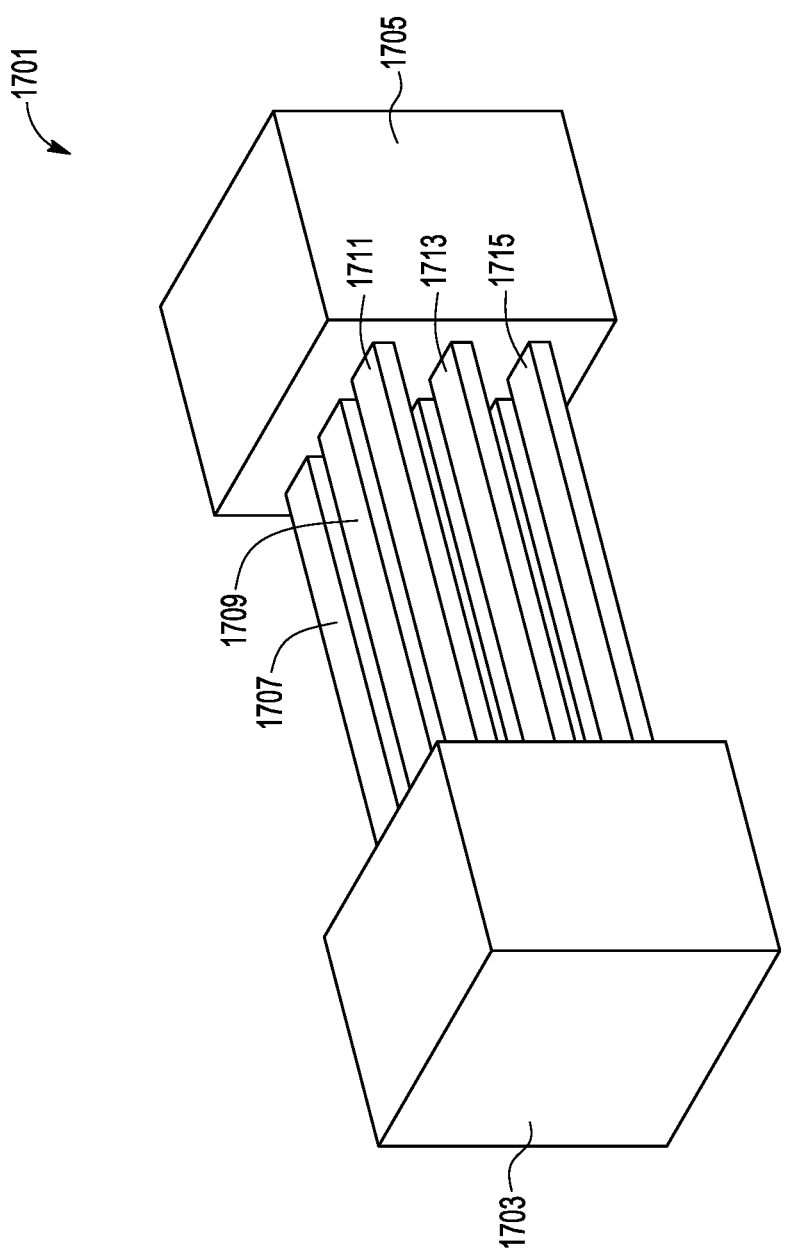
FIG. 17 is a perspective view of portions of a multigate transistor according to another embodiment of the present invention.

FIG. 17 is a perspective view of portions of a transistor 1701 according to another embodiment of the present invention. Transistor 1701 includes a source/drain 1703, source/drain 1705, and 9 channel structures (with structures 1707, 1709, 1711, 1713, and 1715 being shown) connecting source/drain 1703 to source/drain 1705. The channel structures are located in three levels with three channel structures located in each level. The gate structure (not shown) individually surrounds each of the channel structures. In other embodiments, a transistor can have a different number of levels with a different numbers of channel structures per level. Also in other embodiments, the channel structures may be offset with respect to the channel structures in the layer above and the layer below. Each channel structure is formed from epitaxially grown semiconductor material by the processes described herein and having the same crystal orientation.

As disclosed herein, a first structure is "directly above" a second structure if the first structure is located above the second structure in a line having a direction that is perpendicular with the generally planar major side of the wafer. For example, in FIG. 14, channel structure 801 is directly above channel structure 803. Channel structure 801 is not directly above channel structure 805. As disclosed herein, a first structure is "directly beneath" a second structure if the first structure is located beneath the second structure in a line having a direction that is perpendicular with the generally planar major side of the wafer. For example, in FIG. 14, channel structure 803 is directly beneath channel structure 801. Channel structure 805 is not directly beneath channel structure 801. As shown in FIG. 14, each channel structure has a portion of a gate located directly above and directly beneath the channel structure.

In one embodiment, a method for making a transistor includes, in a wafer including a first material and a second material, removing portions of the second material to form an opening in the first material. The first material is located directly over the opening and directly beneath the opening. The method includes epitaxially growing epitaxially grown semiconductor material from a seed layer into the opening. The method includes removing portions of the first material located directly above the epitaxially grown semiconductor material in the opening and directly beneath the epitaxially grown semiconductor material in the opening. The method includes forming a gate material in a location of removed portions of the first material including directly above the epitaxially grown semiconductor material in the opening and directly beneath the epitaxially grown semiconductor material in the opening. The gate material serves as at least one gate for a multi-gate transistor and the epitaxially grown semiconductor material in the opening serves as a channel region for the multi-gate transistor.

In another embodiment, a method for making a transistor includes, in a wafer including a first material, a second material, and a seed layer located beneath the first material and the second material, removing portions of the second material to form a first opening in the first material and a second opening in the first material. The first material is located directly over the first opening, located directly over the second opening, located directly beneath the first opening, and directly beneath the second opening. The method includes epitaxially growing epitaxially grown semiconductor material from the seed layer. The epitaxially grown semiconductor material grows into the first opening and into the second opening. The method includes removing portions of the first material located directly above the epitaxially grown semiconductor material in the first opening, located directly above the epitaxially grown semiconductor material in the second opening, located directly beneath the epitaxially grown semiconductor material in the first opening, and located directly beneath the epitaxially grown semiconductor material in the second opening. The method includes forming a gate material in a location of removed portions of the first material including directly above the epitaxially grown semiconductor material in the first opening, directly above the epitaxially grown semiconductor material in the second opening, directly beneath the epitaxially grown semiconductor material in the first opening, and directly beneath the epitaxially grown semiconductor material in the second opening. The gate material serves as at least one gate for a multi-gate transistor. The epitaxially grown semiconductor material in the first opening serves as a first channel region for the multi-gate transistor, and the epitaxially grown semiconductor material in the second opening serves as a second channel region for the multi-gate transistor.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for making a transistor comprising:
   in a wafer including a first material and a second material, removing portions of the second material to form an opening in the first material wherein the first material is located directly over the opening and directly beneath the opening;
   epitaxially growing epitaxially grown semiconductor material from a seed layer into the opening;
   removing portions of the first material located directly above the epitaxially grown semiconductor material in the opening and directly beneath the epitaxially grown semiconductor material in the opening;
   forming a gate material in a location of removed portions of the first material including directly above the epitaxially grown semiconductor material in the opening and directly beneath the epitaxially grown semiconductor material in the opening, wherein the gate material serves as at least one gate for a multi-gate transistor and the epitaxially grown semiconductor material in the opening serves as a channel region for the multi-gate transistor;
   wherein prior to the removing portions of the second material, removing portions of the first material to expose a first end and a second end of a structure of the second material, wherein the removing portions of the second material includes removing the structure, wherein the first end and the second end are opposite ends of the structure;
   wherein the removing portions of the first material to expose a first end includes forming a second opening in the first material and the removing portions of the first material to expose a second end includes forming a third opening in the first material;
   wherein prior to the epitaxial growing, exposing the seed layer through the second opening in the first material and growing the epitaxially grown semiconductor material from the second opening in the first material into the opening;
   wherein the method further comprises removing the epitaxially grown semiconductor material in the second opening, wherein after removing the epitaxially grown semiconductor material in the second opening, forming a layer of dielectric material on the exposed seed layer.

2. The method of claim 1 further comprising:
   forming the structure of the second material and forming the first material surrounding all sides the structure, wherein the removing portions of the second material includes selectively etching the second material of the structure with an etchant that is selective to the second material and selective with respect to the first material.

3. The method of claim 1 wherein the seed layer is located beneath the first material and the second material.

4. The method of claim 1 wherein:
   the removing portions of the second material further comprises removing portions of the second material to form a fourth opening in the first material wherein the first material is located directly above the fourth opening and directly beneath the fourth opening;
   the epitaxially growing epitaxially grown semiconductor material from the seed layer includes the epitaxially grown semiconductor material growing into the fourth opening;

the forming the gate material includes forming a gate material in a location of removed portions of the first material including directly above the epitaxially grown semiconductor material in the fourth opening and directly beneath the epitaxially grown semiconductor material in the fourth opening, wherein the gate material serves as at least one gate for a multi-gate transistor and the epitaxially grown semiconductor material in the second opening serves as a channel region for the multi-gate transistor.

5. The method of claim 4 wherein the opening includes at least a portion located directly over at least a portion of the fourth opening.

6. The method of claim 1 wherein after the removing portions of the first material and before forming a gate material, forming a gate dielectric layer on exposed surfaces of the epitaxially grown semiconductor material grown in the opening.

7. The method of claim 6 wherein the gate dielectric layer is formed by an atomic layer deposition process.

8. The method of claim 1 wherein the seed layer is not exposed through the third opening in the first material.

9. The method of claim 1 further comprising:
after the epitaxially growing, removing epitaxially grown semiconductor material in the third opening;
after the removing the epitaxially grown semiconductor material in the second opening and in the third opening, forming a current terminal material in the second opening and a current terminal material in the third opening, wherein the current terminal material in the second opening and the current terminal.

10. The method of claim 9 wherein the forming the current terminal material in the second opening and the forming the current terminal material in the third opening occurs prior to forming the gate material.

11. The method of claim 9 wherein the current terminal material is characterized as a metal.

12. The method of claim 1 wherein the gate material is characterized as a metal.

13. The method of claim 1 wherein the first material is characterized as an oxide and the second material is characterized as silicon.

14. The method of claim 1 wherein the forming a layer of dielectric material on the exposed seed layer includes forming a layer of oxide material on the exposed seed layer.

15. A method for making a transistor comprising:
in a wafer including a first material and a second material, removing portions of the second material to form an opening in the first material wherein the first material is located directly over the opening and directly beneath the opening;
epitaxially growing epitaxially grown semiconductor material from a seed layer into the opening;
removing portions of the first material located directly above the epitaxially grown semiconductor material in the opening and directly beneath the epitaxially grown semiconductor material in the opening;
forming a gate material in a location of removed portions of the first material including directly above the epitaxially grown semiconductor material in the opening and directly beneath the epitaxially grown semiconductor material in the opening, wherein the gate material serves as at least one gate for a multi-gate transistor and the epitaxially grown semiconductor material in the opening serves as a channel region for the multi-gate transistor;
wherein prior to the removing portions of the second material, removing portions of the first material to expose a first end and a second end of a structure of the second material, wherein the removing portions of the second material includes removing the structure, wherein the first end and the second end being opposite ends of the structure;
wherein:
the removing portions of the first material to expose a first end includes forming a second opening in the first material and the removing portions of the first material to expose a second end includes forming a third opening in the first material;
prior to the epitaxial growing, exposing the seed layer through the second opening in the first material and growing the epitaxially grown semiconductor material from the second opening in the first material into the opening;
wherein the method further comprising removing the epitaxially grown semiconductor material in the second opening, wherein after removing the epitaxially grown semiconductor material in the second opening, using an anodic oxide process to form a layer of oxide material on the exposed seed layer.

* * * * *